(12) United States Patent
Kim et al.

(10) Patent No.: US 7,855,109 B2
(45) Date of Patent: Dec. 21, 2010

(54) METHOD FOR MANUFACTURING A SEMICONDUCTOR DEVICE CAPABLE OF PREVENTING THE GENERATION OF A BRIDGE BETWEEN A RECESS GATE AND A PLC PLUG

(75) Inventors: Hyung Hwan Kim, Gyeonggi-do (KR); Kwang Kee Chae, Gyeonggi-do (KR); Jong Goo Jung, Gyeonggi-do (KR); Ok Min Moon, Gyeonggi-do (KR); Young Bang Lee, Gyeonggi-do (KR); Sung Eun Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 175 days.

(21) Appl. No.: 12/345,755

(22) Filed: Dec. 30, 2008

(65) Prior Publication Data
US 2010/0151656 A1    Jun. 17, 2010

(30) Foreign Application Priority Data
Dec. 16, 2008    (KR) .................. 10-2008-0127682

(51) Int. Cl.
*H01L 21/337* (2006.01)
(52) U.S. Cl. ................ 438/196; 438/435; 257/E21.546
(58) Field of Classification Search .............. 438/196, 438/207, 218, 221, 248, 296, 435; 257/374, 257/499, 501, E21.545, E21.546, E21.564
See application file for complete search history.

(56) References Cited

U.S. PATENT DOCUMENTS
7,217,623 B2 *  5/2007  Kim et al. ................... 438/283
7,459,358 B2 * 12/2008  Lee et al. .................... 438/197

FOREIGN PATENT DOCUMENTS
KR    1020080045451 A    5/2008

* cited by examiner

*Primary Examiner*—Khiem D Nguyen
(74) *Attorney, Agent, or Firm*—Ladas & Parry LLP (57) ABSTRACT

A method for manufacturing a semiconductor device according to the present invention, comprising the steps of: forming a screen oxide layer over the surface of an active region of a semiconductor substrate in which an isolation structure defining the active region is formed; forming a first recess pattern in the active region and a second recess pattern in the isolation structure by etching a gate forming area in the active region and the isolation structure part extended thereto; removing the screen oxide film and simultaneously expanding the width of the second recess pattern; forming a first insulation dielectric layer over the resultant of the substrate having the second recess pattern with the expanded width so that the first insulation dielectric layer is blocked at the upper end thereof in the first recess pattern and it is deposited along the profile in the second recess pattern; forming a second insulation dielectric layer over the first insulation dielectric layer so that the second recess patter is not filled; forming a third insulation dielectric layer over the second insulation dielectric layer so that the second recess pattern is filled; and removing the third, second, and first insulation dielectric layers formed over the active region including the first recess pattern and the isolation structure between the second recess patterns.

16 Claims, 6 Drawing Sheets

METHOD FOR MANUFACTURING A SEMICONDUCTOR DEVICE CAPABLE OF PREVENTING THE GENERATION OF A BRIDGE BETWEEN A RECESS GATE AND A PLC PLUG

CROSS-REFERENCE TO RELATED APPLICATIONS

The present application claims priority to Korean patent application number 10-2008-0127682 filed on Dec. 16, 2006, which is incorporated herein by reference in its entirety.

BACKGROUND OF THE INVENTION

The present invention relates to a method for manufacturing a semiconductor device, and more particularly, to a method for manufacturing a semiconductor device capable of preventing the generation of a bridge between a recess gate and a LPC plug in a part of an isolation layer.

As a design role of a semiconductor device has been reduced, there has been a limit to implementing a required threshold voltage (Vt) target with an existing planar-type channel structure. Therefore, a study on a semiconductor device having a three-dimensional structure of channel has been actively developed, and a semiconductor device having a recess channel and a semiconductor device having a protrusion channel have been proposed as a result of such a study. Furthermore, a semiconductor device having a saddle fin shaped channel, where the recess channel and the protrusion channel are combined, has been proposed.

Compared with the existing semiconductor device having the planar type channel, the semiconductor device having the saddle fin shaped channel increases an effective channel length so that it can secure desired threshold voltage, and the effective channel length is increased so that it has improved current driving characteristics.

Although not shown, in the semiconductor devices having such recess channel and saddle fin shaped channel, not only a gate forming region in an active region is recessed but also an isolation layer part extended to the gate forming area is recessed together. In particular, in the semiconductor device having the saddle fin shaped channel, the isolation structure part extended to the gate forming area is recessed to be deeper than the gate forming area recessed in the active region so that the side surface of the gate forming area recessed in the active region is exposed.

Meanwhile, as the design role of the semiconductor device is reduced, flowable dielectric material such as a spin on dielectric (SOD) layer has been used as trench filling material. However, the SOD layer has a higher wet etching speed to cause an etching loss during a pre cleaning step prior to forming a gate dielectric film.

Therefore, when manufacturing the semiconductor device having the recess channel or the saddle fin shaped channel by applying the SOD layer as the trench filling material according to the prior art, a CD of recess patterns formed on the isolation layer is expanded and thus, a shortage of margins overlapping the gate occurs. As a result, a self align contact fail such as a generation of a bridge between the gate and a LPC plug occurs during a subsequent land plug contact (LPC) process.

SUMMARY OF THE INVENTION

Embodiments of the present invention are directed to a method for manufacturing a semiconductor device capable of constantly securing a recess pattern CD on an isolation layer when manufacturing the semiconductor device having a recess or a saddle fin shaped channel by applying a SOD layer as a trench filling material.

Also, embodiments of the present invention are directed to a method for manufacturing a semiconductor device capable of preventing the generation of a bridge between a gate and a LPC plug by constantly securing the recess pattern CD on the isolation layer.

Furthermore, embodiments of the present invention are directed to a method for manufacturing a semiconductor capable of improving reliability and manufacturing yields of the device by preventing the generation of the bridge between the gate and the LPC plug.

In one embodiment, a method for manufacturing a semiconductor device comprises the steps of: forming a screen oxide layer over the surface of an active region of a semiconductor substrate in which an isolation structure defining the active region is formed; forming a first recess pattern in the active region and a second recess pattern in the isolation structure by etching a gate forming area in the active region and the isolation structure part extended thereto; removing the screen oxide film and simultaneously expanding the width of the second recess pattern; forming a first insulation dielectric layer over the resultant of the substrate having the second recess pattern with the expanded width so that the first insulation dielectric layer is blocked at the upper end thereof in the first recess pattern and it is deposited along the profile in the second recess pattern; forming a second insulation dielectric layer over the first insulation dielectric layer so that the second recess patter is not filled; forming a third insulation dielectric layer over the second insulation dielectric layer so that the second recess pattern is filled; and removing the third, second, and first insulation dielectric layers formed over the active region including the first recess pattern and the isolation structure between the second recess patterns.

The method further comprises, after forming the screen oxide layer and before forming the first and second recess patterns, performing an ion-implantation process on the semiconductor substrate over which the screen oxide layer is formed.

The step of removing the screen oxide film and simultaneously expanding the width of the second recess pattern is performed through an overetching process.

The step of removing the screen oxide film and simultaneously expanding the width of the second recess pattern is performed so that an interval between the second recess patterns becomes 5 to 20 nm.

The first insulation dielectric layer is formed of an oxide layer, preferably, a Low Pressure TEOS (LPTEOS) layer.

The first insulation dielectric layer is formed at a thickness of 100 to 300 Å.

The second insulation dielectric layer is formed of an nitride layer.

The second insulation dielectric layer is formed at a thickness of 50 to 200 Å.

The third insulation dielectric layer is formed of an oxide layer, preferably, a sub atmosphere TEOS (SATEOS) layer.

The third insulation dielectric layer is removed through a chemical mechanical polishing (CMP) process, the CMP process being performed using slurry having removal rate of the nitride layer to the oxide layer being 1:10 to 1:200.

The second insulation dielectric layer is removed through a wet etching process using a phosphate ($H_3PO_4$) solution.

The first insulation dielectric layer is removed through a wet etching process using a HF or BOE solution.

The method further comprises, after the step of removing the third, second, and first insulation dielectric layers formed over the active region including the first recess pattern and the isolation structure between the second recess patterns, forming a gate dielectric layer over the active region including the surface of the first recess pattern.

DESCRIPTION OF SPECIFIC EMBODIMENTS

Hereinafter, the preferred embodiments of the present invention will be described with reference to the accompanying drawings.

Figure 1:
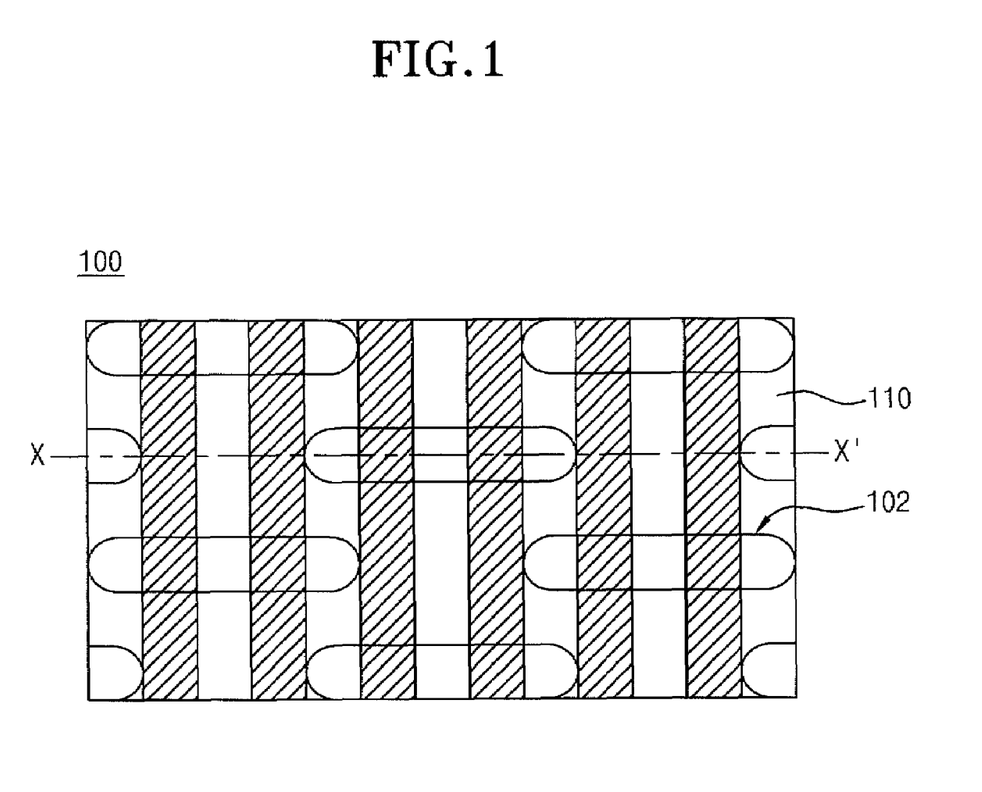
FIG. 1 is a plan view illustrating a method for manufacturing a semiconductor device in accordance with an embodiment of the present invention.

FIG. 1 is a plan view illustrating a method for manufacturing a semiconductor device in accordance with an embodiment of the present invention, and FIGS. 2A through 2J are cross-sectional views illustrating the steps of a method for manufacturing a semiconductor device taken along line X-X' of FIG. 1. Herein, only FIGS. 2A through 2J will be described, omitting description for FIG. 1.

Figure 2A:
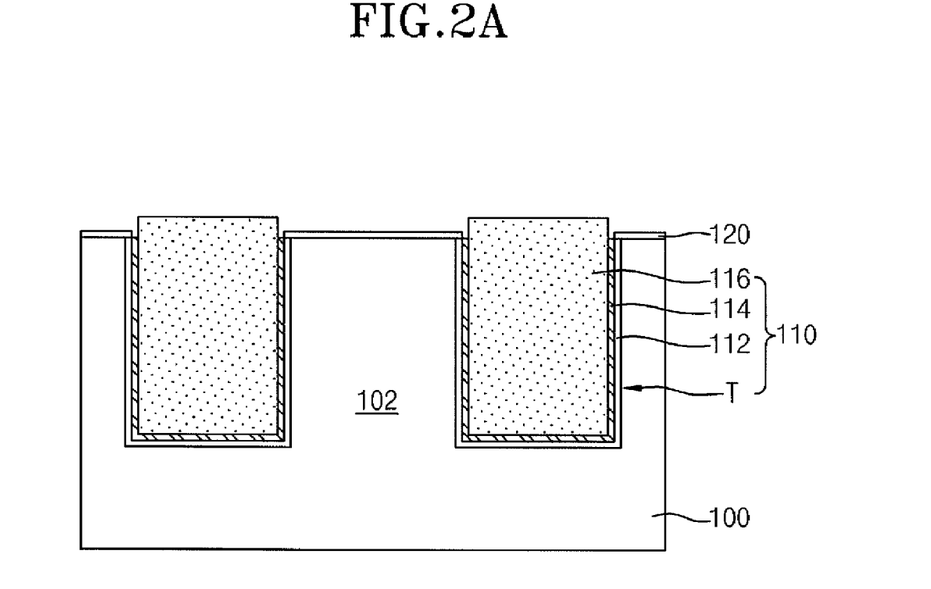
FIGS. 2A through 2J are cross-sectional views illustrating the steps of a method for manufacturing a semiconductor device taken along line X-X' of FIG. 1.

Referring to FIG. 2A, an isolation structure 110 defining an active region 102 is formed within a semiconductor substrate 100 according to a well-known STI process. The isolation structure 110 includes a trench T, a sidewall oxide layer 112 formed over the trench T, a liner nitride layer 114 formed over the sidewall oxide layer 112, and a dielectric layer formed over the liner nitride layer 114 to fill the trench T, for example, a spin on dielectric (SON) layer. A screen oxide layer 120 is formed over the active region 102 in the semiconductor substrate 100 defined by the isolation structure 110. Ion-implantation processes including a threshold voltage control ion-implantation is performed on the semiconductor substrate 100 over which the screen oxide layer 120 is formed. The screen oxide layer 120 is formed to prevent the ion-implantation damage on the surface of the semiconductor substrate 100 during the ion-implantation process.

Figure 2B:
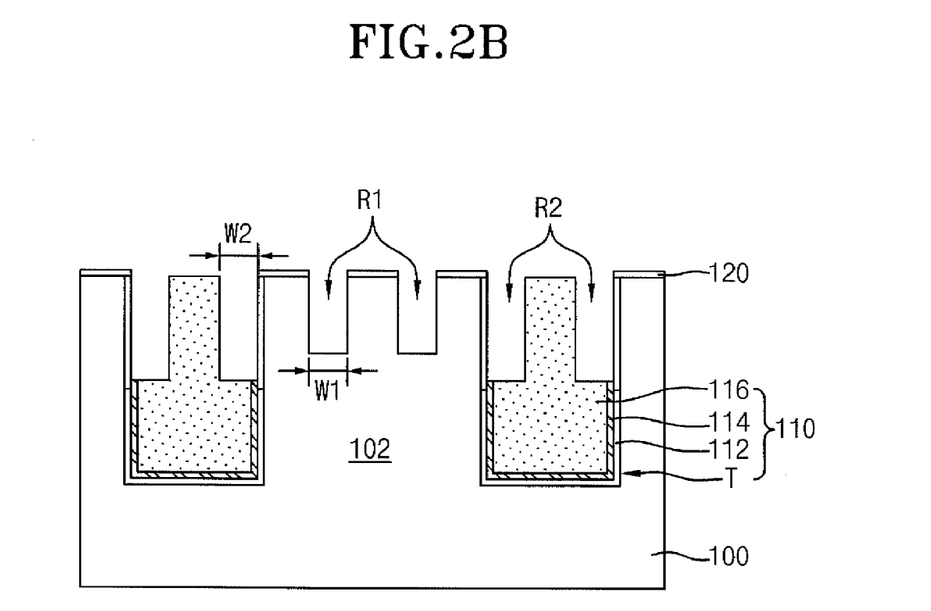

Referring to FIG. 2B, a recess mask (not shown) exposing a gate forming area and the isolation structure part extended thereto in the active region 102 is formed over the resultant of the semiconductor substrate 100 on which the ion-implantation process has been performed. A first recess pattern R1 is formed in the gate forming area in the active region 102 by etching the gate forming area and the isolation structure part extended thereto in the exposed active region 102, and continuously, a second recess pattern R2 is formed in the isolation structure 110 by additionally etching the etched isolation structure 110 part for forming a saddle fin shaped channel. Thereafter, the recess mask is removed.

When forming the second recess pattern R2 in the isolation structure 110, a portion of a liner nitride layer 114 formed on a sidewall of the active region 102 may also be removed. In this case, a portion of the sidewall oxide layer 112 is exposed by the removal of the liner nitride layer 114.

Here, the second recess pattern R2 in the isolation structure 110 is formed to be deeper than the first recess pattern R1 in the active region 102 when forming the saddle fin shaped channel so that the side surface of the recessed gate forming area in the active region 102 is exposed. In this case, the depth of the recess in the isolation structure 110 is deeper than that in the active region 102 through the additional etching, such that the width W2 of the second recess pattern R2 in the isolation structure 110 may be wider than the width W1 of the first recess pattern R1 in the active region 102. For example, when the first recess pattern R1 is formed to have a width W1 of 25 to 30 nm, the second recess pattern R2 may have a larger width W2 of 30 to 35 nm.

Meanwhile, the second recess pattern R2 in the isolation structure 110 is formed to have the same depth as the first recess pattern R1 in the active region 102 when forming the recess channel. In this case, the first recess pattern R1 and the second recess pattern R2 are formed to have almost the same widths W1 and W2.

Figure 2C:
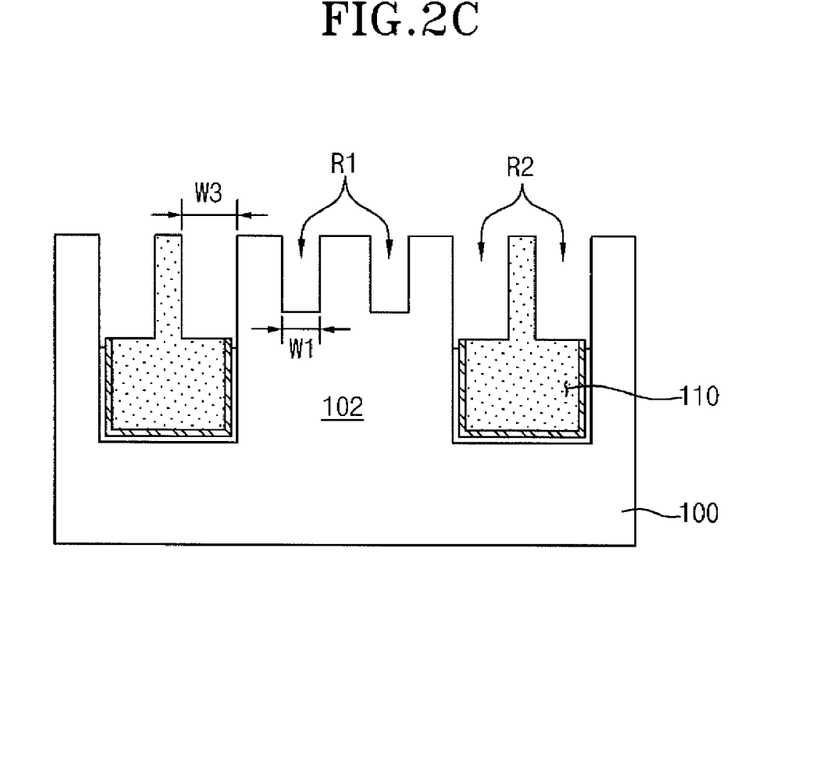

Referring to FIG. 2C, the screen oxide layer is removed through a wet etching process or a dry etching process. Here, an overetching process is performed in order to remove the screen oxide layer and theretohrugh, a width W3 of the second recess pattern R2 in the isolation structure 110 is widen. For example, assuming that the entire width of the isolation structure 110 is 125 to 150 nm, the etching process for removing the screen oxide layer is performed so that the width of the isolation structure 110 remaining between the second recess patterns R2, more specifically, the width of the SOD layer 116, becomes about 5 to 20 nm. In this case, the expanded width W3 of the second recess pattern R3 becomes about 35 to 60 nm. Here, when the etching process for removing the screen oxide layer is performed, the sidewall oxide layer 112 part over the sidewall of the trench T exposed by the second recess pattern R2 is also removed.

Meanwhile, when performing the etching process for removing the screen oxide layer is performed, the width of the first recess pattern R1 in the active region 102 is not changed.

Figure 2D:
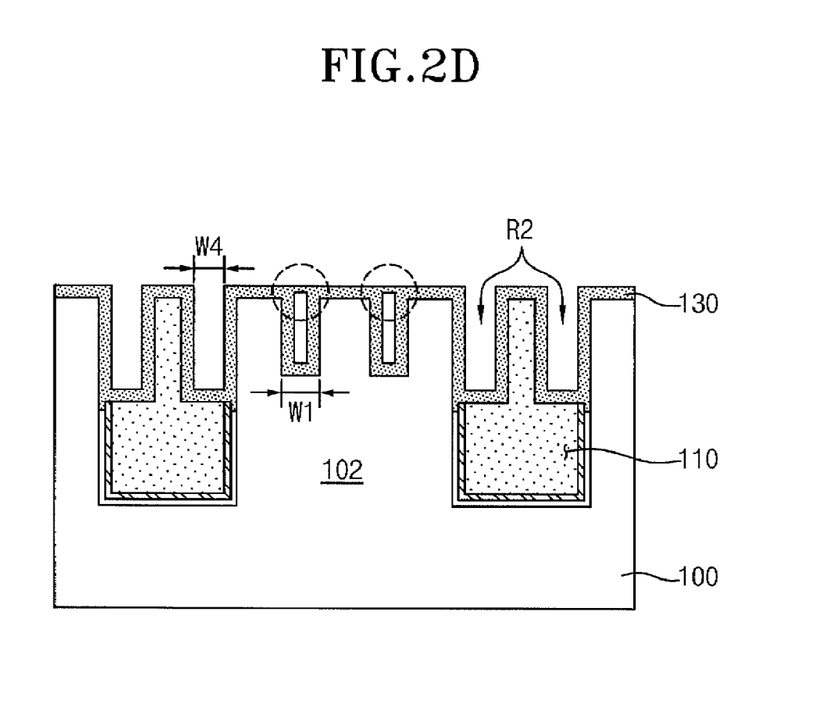

Referring to FIG. 2D, a first insulation dielectric layer 130 having a thickness of 100 to 300 Å is deposited over the semiconductor substrate 100 including the isolation structure 110 having the second recess pattern R2 with the increased width and the active region 102 having the first recess pattern R1. The first insulation dielectric layer 130 is formed of an oxide layer having an excellent step coverage, for example, a low pressure TEOS (LPTEOS) layer. When forming the first insulation dielectric layer 130 formed of the LPTEOS layer, the width W1 of the first recess pattern R1 in the active region 102 is narrow, such as about 25 to 30 nm, so that the upper end thereof is blocked by an overhang but a seam is formed in the lower end thereof, although not specifically shown.

The width W4 of the second recess pattern R2 in the isolation structure 110 is reduced by the first insulation dielectric layer 130. Preferably, the second recess pattern R2 has a width by the width originally designed, for example, a width of 25 to 30 nm, and the second recess patterns R2 in the isolation structure 110 have a width of 25 to 30 nm, including the first insulation dielectric layer 130.

Figure 2E:
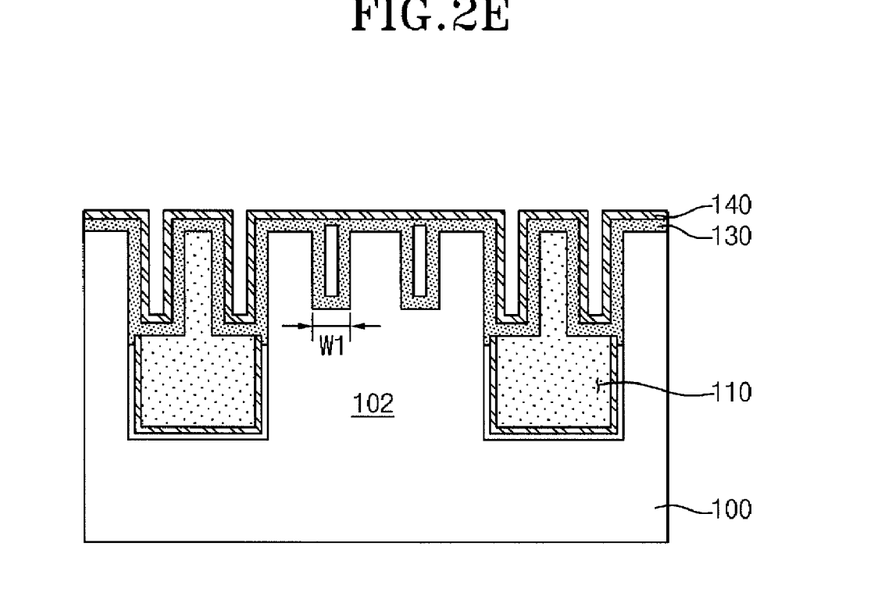

Referring to FIG. 2E, a second insulation dielectric layer that is to be used as a polish stop layer during a subsequent chemical mechanical polishing (CMP) process is formed over the first insulation dielectric layer 130. The second insulation dielectric layer is formed of a nitride layer and is formed at a thickness to the extent that the second recess pattern R2 is not completely filled, that is, a thickness of about 50 to 200 Å. Over the active region 102, the second insulation dielectric layer 140 formed of the nitride layer is formed only over the first insulation dielectric layer considering that the upper end of the first recess pattern R1 is blocked, whereas over the isolation structure 110, the second insulation dielectric layer is also formed within the second recess pattern R2 along the profile of the first insulation dielectric layer 130.

Figure 2F:
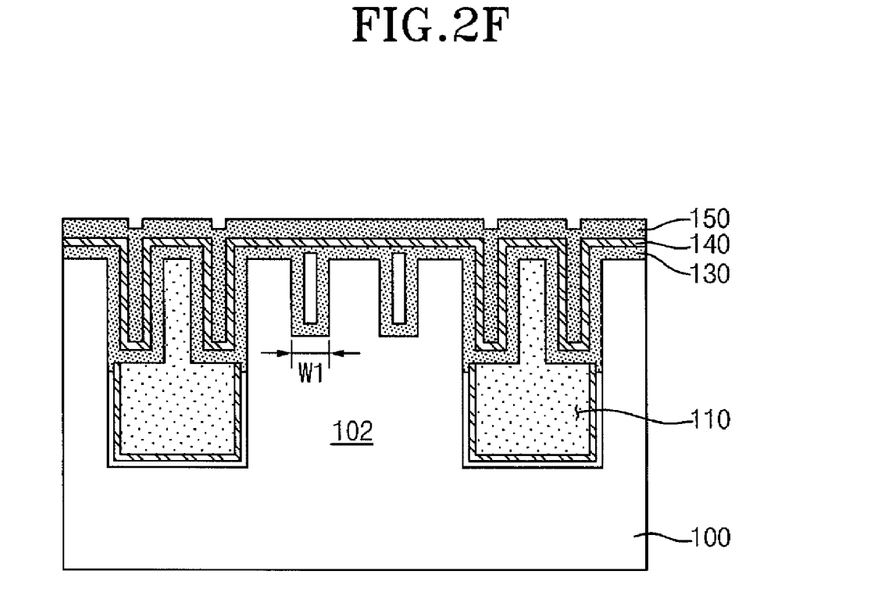

Referring to FIG. 2F, a third insulation dielectric layer 150 is formed over the second insulation dielectric layer 140 formed of nitride layer according to a deposition method so that the second recess pattern R2 in the isolation structure 100 is completely filled. The third insulation dielectric layer 150 is formed by depositing an oxide layer having an excellent step coverage, for example, a sub atmosphere TEOS (SATEOS) layer. Also, the third insulation dielectric layer 150 may also be formed to have a predetermined thickness on the surface of the second insulation dielectric layer 140 formed of the nitride layer through an oxidation process other than the deposition method, preferably, a thickness to completely fill the second recess pattern R2.

Here, the third insulation dielectric layer 150 is formed so that the second insulation dielectric layer 140 part formed within the second recess pattern R2 in the isolation structure 110 is not removed during a subsequent removing process of the second insulation dielectric layer 140.

Figure 2G:
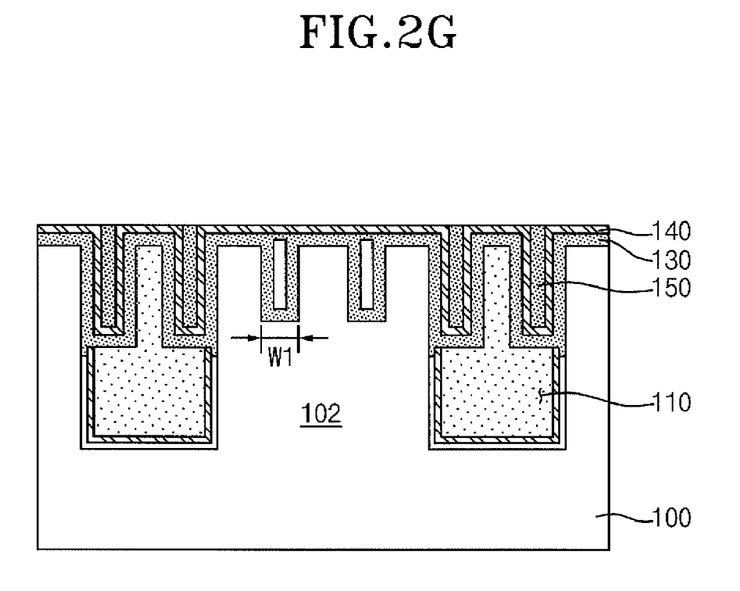

Referring to FIG. 2G, the third insulation dielectric layer 150 formed of the oxide layer is removed through a CMP process using the second insulation dielectric layer 140 formed of the nitride layer as the polish stop layer. The CMP process is performed using slurry having selectivity to the nitride layer, for example, slurry having removal rate of the nitride layer to the oxide layer being 1:10 or more, preferably, 1:10 to 1:200. As the result of the CMP process, the third insulation dielectric layer 150 part formed over the second insulation dielectric layer 140 part in the upper part of the active region 102 is removed, however the third insulation dielectric layer 150 part filled within the second recess pattern R2 is not removed to remain.

Figure 2H:
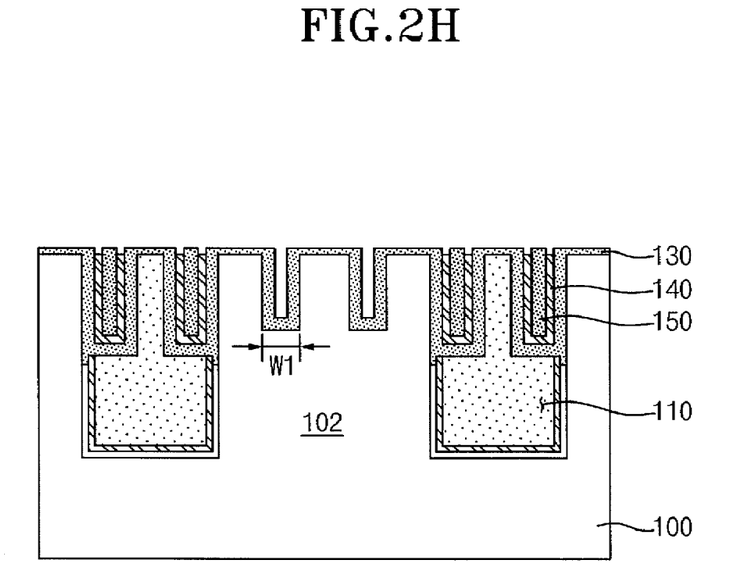

Referring to FIG. 2H, the second insulation dielectric layer 140 part formed of the nitride layer exposed by removing the third insulation dielectric layer 150 is removed through a wet etching process using a phosphate ($H_3PO_4$) solution. At this time, all the second insulation dielectric layer 140 parts formed between the second recess patterns R2 in the active region 102 and the isolation structure 110 are removed, whereas the second insulation dielectric layer 140 part formed within the second recess pattern R2 in the isolation structure 110 is partially removed in a vertical direction (Y) but most of them are not removed by the third insulation dielectric layer 150.

Figure 2I:
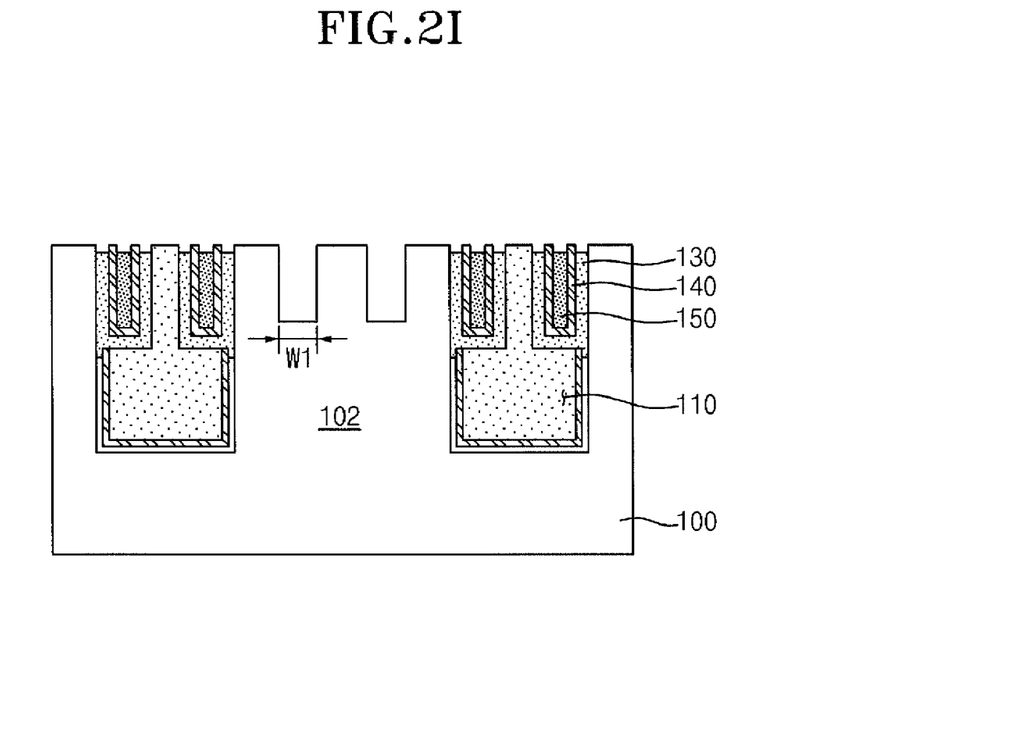

Referring to FIG. 2I, the first insulation dielectric layer 130 exposed by removing the second insulation dielectric layer 140 formed of the nitride layer is removed through a wet etching process using a HF or BOE solution. At this time, all the first insulation dielectric layer 130 part formed in the first recess pattern R1 in the active region 102 is removed through the seam, whereas only the surface of the first insulation dielectric layer 130 formed within the second recess pattern R2 in the isolation structure 110 is partially removed in a vertical direction but most of them are not removed to remain.

Meanwhile, although the second recess pattern R2 is illustrated to be filled by the first insulation dielectric layer 103, the second insulation dielectric layer 140, and the third insulation dielectric layer 150, the first insulation dielectric layer 103, the second insulation dielectric layer 140, and the third insulation dielectric layer 150 are actually removed in the second recess pattern R2 part adjacent to the gate forming area in the active region 102. Therefore, the side surface of the gate forming area in the active region 102 is exposed so that a saddle fin shaped channel structure can be obtained.

Figure 2J:
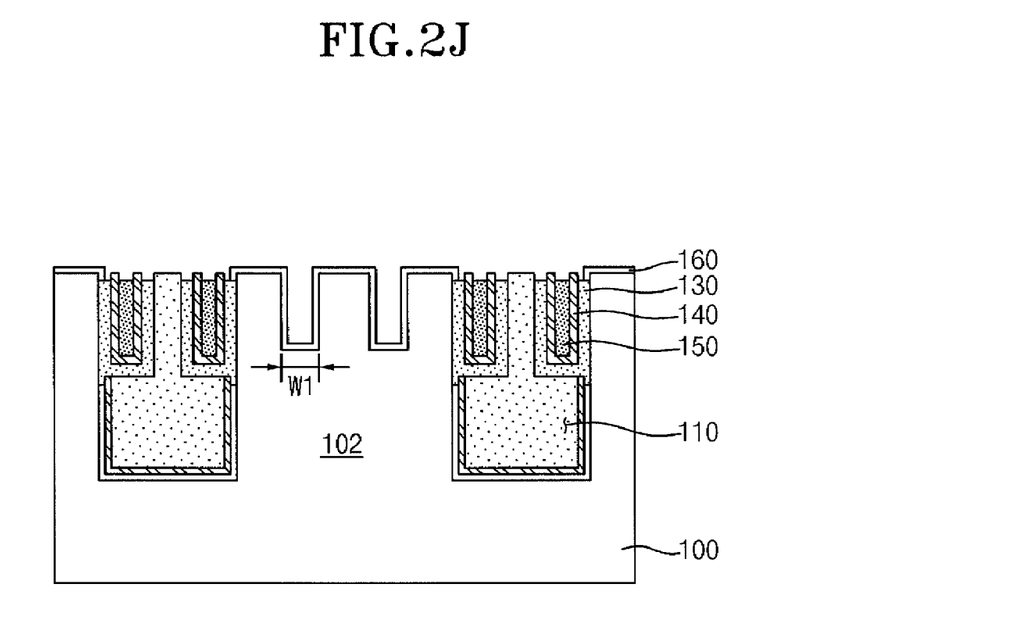

Referring to FIG. 23, a gate dielectric layer 160 is formed over the active region 102 of the exposed semiconductor substrate 100 including the surface of the first recess pattern R1.

Thereafter, although not shown, after a gate conductive layer and a hard mask layer are formed sequentially over the resultant of the semiconductor substrate on which the gate dielectric layer is formed, a gate is formed over the gate reforming area recessed in the active region and the isolation structure part extended thereto by etching the gate conductive layer and the hard mask layer, and then a series of well-known subsequent processes are performed in sequence, thereby completing the manufacture of the semiconductor device having the saddle fin shaped channel.

As is apparent from the above description, in the present invention, the CD in the part within the isolation structure on which the gate is to be formed can be constantly secured so that an overlapping margin between the gate and the LPC plug can be sufficiently secured in the subsequent process. Therefore, the generation of the bridge between the gate and the LPC plug is prevented so that the generation of the SAC fail can be prevented, consequently, making it possible to improve reliability and manufacturing yields of the device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming a screen oxide layer over a surface of an active region of a semiconductor substrate in which an isolation structure defining the active region is formed;
    forming a first recess pattern in the active region and a second recess pattern in the isolation structure by etching a gate forming area in the active region and the isolation structure part extended thereto;
    removing the screen oxide film and simultaneously expanding the width of the second recess pattern;
    forming a first insulation dielectric layer over the resultant of the substrate having the second recess pattern with the expanded width so that the first insulation dielectric layer is blocked at the upper end thereof in the first recess pattern and it is deposited along a profile in the second recess pattern;
    forming a second insulation dielectric layer over the first insulation dielectric layer so that the second recess pattern is not filled;
    forming a third insulation dielectric layer over the second insulation dielectric layer so that the second recess pattern is filled; and
    removing the third, second, and first insulation dielectric layers formed over the active region including the first recess pattern and the isolation structure between the second recess pattern.

2. The method according to claim 1, further comprising:
    after forming the screen oxide layer and before forming the first and second recess patterns, performing an ion-implantation process on the semiconductor substrate over which the screen oxide layer is formed.

3. The method according to claim 1, wherein the step of removing the screen oxide film and simultaneously expanding the width of the second recess pattern is performed through an overetching process.

4. The method according to claim 1, wherein the step of removing the screen oxide film and simultaneously expanding the width of the second recess pattern is performed so that an interval between the second recess patterns becomes 5 to 20 nm.

5. The method according to claim 1, wherein the first insulation dielectric layer is formed of an oxide layer.

6. The method according to claim 5, wherein the oxide layer is formed of a Low Pressure TEOS (LPTEOS) layer.

7. The method according to claim 1, wherein the first insulation dielectric layer is formed at a thickness of 100 to 300 Å.

8. The method according to claim 1, wherein the second insulation dielectric layer is formed of an nitride layer.

9. The method according to claim 1, wherein the second insulation dielectric layer is formed at a thickness of 50 to 200 Å.

10. The method according to claim 1, wherein the third insulation dielectric layer is formed of an oxide layer.

11. The method according to claim 10, wherein the third insulation dielectric layer is formed of a sub atmosphere TEOS (SATEOS) layer.

12. The method according to claim 1, wherein the third insulation dielectric layer is removed through a chemical mechanical polishing (CMP) process.

13. The method according to claim 12, wherein the CMP process is performed using slurry having removal rate of the nitride layer to the oxide layer being 1:10 to 1:200.

14. The method according to claim 1, wherein the second insulation dielectric layer is removed through a wet etching process using a phosphate ($H_3PO_4$) solution.

15. The method according to claim 1, wherein the first insulation dielectric layer is removed through a wet etching process using a HF or BOE solution.

16. The method according to claim 1, further comprising:
after the step of removing the third, second, and first insulation dielectric layers formed over the active region including the first recess pattern and the isolation structure between the second recess patterns, forming a gate dielectric layer over the active region including a surface of the first recess pattern.

* * * * *